United States Patent
Lee

(10) Patent No.: US 7,110,296 B2
(45) Date of Patent: Sep. 19, 2006

(54) FLASH MEMORY DEVICE CAPABLE OF IMPROVING A DATA LOADING SPEED

(75) Inventor: Sok Kyu Lee, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 121 days.

(21) Appl. No.: 10/878,093

(22) Filed: Jun. 28, 2004

(65) Prior Publication Data

US 2005/0141275 A1 Jun. 30, 2005

(30) Foreign Application Priority Data

Dec. 24, 2003 (KR) .................. 10-2003-0096240

(51) Int. Cl.
*G11C 16/04* (2006.01)

(52) U.S. Cl. .................. 365/185.12; 365/185.23; 365/185.18

(58) Field of Classification Search ........... 365/185.12, 365/185.22, 185.05, 185.18, 185.23
See application file for complete search history.

(56) References Cited

U.S. PATENT DOCUMENTS

| | | | | | |
|---|---|---|---|---|---|
| 4,729,117 | A | * | 3/1988 | Osaka | 365/200 |
| 5,612,713 | A | * | 3/1997 | Bhuva et al. | 345/84 |
| 5,671,178 | A | * | 9/1997 | Park et al. | 365/185.22 |
| 5,966,326 | A | * | 10/1999 | Park et al. | 365/185.11 |
| 6,067,248 | A | * | 5/2000 | Yoo | 365/185.03 |
| 6,807,098 | B1 | * | 10/2004 | Jeong et al. | 365/185.12 |
| 6,937,510 | B1 | * | 8/2005 | Hosono et al. | 365/185.03 |

* cited by examiner

*Primary Examiner*—Huan Hoang
(74) *Attorney, Agent, or Firm*—Marshall, Gerstein & Borun LLP

(57) ABSTRACT

Provided is related to a flash memory device, comprising an input receiver to input data, a data selector for generating a plurality of control signals in accordance with recognizing whether the input data in the data receiver is either the data to be programmed or the data to be erased, a data load path being enabled for data to be programmed while disabled for data to be erased, in response to the control signal, and a page buffer for storing the input data from the data load path. The present invention improves a data loading speed and enhances power consumption property by reducing current dissipation.

18 Claims, 1 Drawing Sheet

FLASH MEMORY DEVICE CAPABLE OF IMPROVING A DATA LOADING SPEED

BACKGROUND

1. Field of the Invention

The present invention relates to a flash memory device, and specifically, to a flash memory device improving loading speed and reducing current consumption, by selecting input data through IO pad and enabling a data load path for data to be programmed while disabling the data load path for data to be erased.

2. Discussion of Related Art

In applying data to NAND type flash memory cells, a data loading command is applied to the flash memory device and data are loaded on a page buffer 40 by way of IO pads with increasing address values in sequence. The data to be programmed, generally, are transmitted to the page buffer in the unit of byte or word in sequence. If data to be programmed, corresponding to a data volume of one page, are all loaded on the page buffer, the data stored in the page buffer are programmed in a memory cell array by a page program command all at once.

The page buffer conserves the potential of power supply voltage level Vcc as its initial value. That is, the initial value of the page buffer is set by a program bias condition. Typically, data input through IO pads are continuously written in the page buffer by way of data paths in a power supply voltage level Vcc or a ground voltage level Vss.

In a normal case of a NAND type flash memory device, the data should be loaded by 512×8 bit in 512 cycle times. But if the logical polarity of data is opposite to the previous data while loading the data, it increases current consumption, which causes power consumption heavier especially when 8-bit data is transferred at the same time.

SUMMARY OF THE INVENTION

The present invention is directed to a flash memory device capable of improving the data loading speed by selecting the input data through IO pad with activating only the data path for data to be programmed, and preventing power loss due to current consumption by a transient current.

One aspect of the present invention is to provide a flash memory device, including: an input receiver to input data; a data selector for generating a plurality of control signals in accordance with recognizing whether the input data in the data receiver is data to be programmed or data to be erased; a data loading path enabled for data to be programmed while disabled for data to be erased, in response to the control signal; and a page buffer for storing the input data supplied from the data load path.

The data selector includes a plurality of NOR gates to output the control signals in response to the enable signal and the input data.

The enable signal is a row active signal.

Another aspect of the present invention is to provide a flash memory device comprising: an input receiver receiving a data, wherein the data is a programming data or an erasing date; a data selector including a plurality of NOR gates, wherein the NOR gates receive an enable signal and the data from the input receiver and generate a plurality of control signals in accordance with the data; a data loading path receiving the control signal from the data selector, wherein the data loading path is enabled or disabled in accordance with the control signal; and a page buffer for storing the input data supplied from the data load path enabled in accordance with the control signal.

Further another aspect of the present invention is to provide a flash memory device comprising: an input receiver receiving a data, wherein the data is a programming data or an erasing date; a data selector receiving a row active signal and the data from the input receiver and generating a plurality of control signals in accordance with the data; a data loading path receiving the control signal from the data selector, wherein the data loading path is enabled or disabled in accordance with the control signal; and a page buffer for storing the input data supplied from the data load path enabled in accordance with the control signal.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

Figure 1:
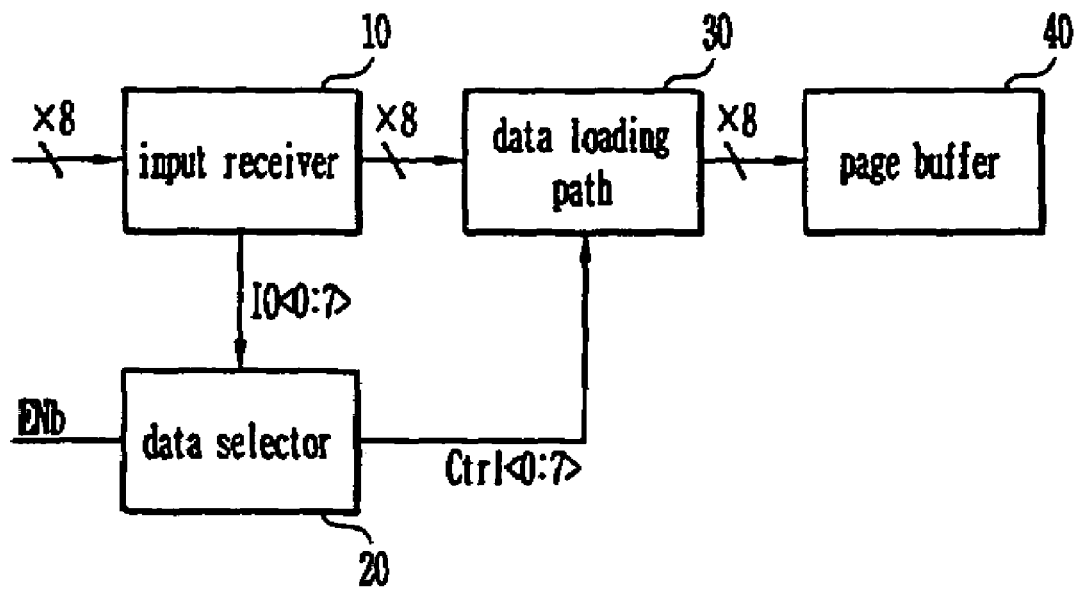
FIG. 1 is a block diagram of a flash memory device according to an embodiment of the present invention.

FIG. 1 is a block diagram of a NAND type flash memory device according to an embodiment of the present invention.

Data to be programmed (x8) is input to an input receiver 10 through IO pad. A data selector 20 distinguishes the data into one to be programmed "0" or the other to be erased "1", and then generates control signals ctrl<0:7>. The control signals ctrl<0:7> enable only a part of the data loading path 30 corresponding to the data to be programmed in fact. To the contrary, the control signals ctrl<0:7> disable the other part of the data loading path 30 corresponding to the data to be erased, keeping the other part of the data loading path 30 in an initial state (i.e., in an erase bias condition) of the page buffer.

This one-time setup function for the data loading path 30 makes it available to loaded data directly on the desired page buffer in performing a data loading operation with the next 512 cycle times, without a change of the data load path. Therefore, it is possible to make a programming speed faster and to reduce current consumption due to switching operations.

Figure 2:
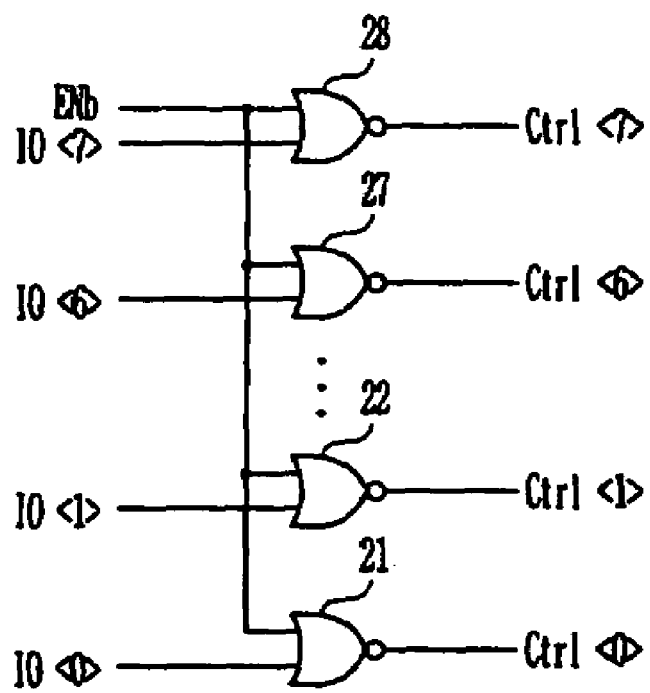
FIG. 2 is a circuit diagram of a data selector according to an embodiment of the present invention.

FIG. 2 is a circuit diagram of the data selector 20 according to an embodiment of the present invention. The data selector 20 is constructed of a plurality of NOR gates 21~28 inputting an input enable signal ENb and the input data from the input receiver 10.

When the input enable signal ENb is active in a low level, the NOR gates 21–28 carry out operations of logical combination with the input data IO<0:7> supplied from the IO receiver 10, and thereby the control signals ctrl<0:7> are output each from the NOR gates. For example, if the enable signal ENb is input in a low level and the first input data 100 is input in a low level as data to be programmed, the first NOR gate 21 outputs the first control signal ctrl0 of a high level from the local combination with them. On the other hand, if the enable signal ENb is input in a low level and the second input data IO1 is input in a high level as data to be erased, the second NOR gate 22 outputs the second control signal ctrl1 of a low level from the local combination with them. By such a manner, the data loading path 30 is alternatively distinguished in accordance to the case corresponding to data to be programmed or to be erased.

The control signals ctrl<0:7> of high level enable the data loading path 30, while the control signals ctrl<0:7> of low level disable the data loading path 30.

As described above, the flash memory device according to the present invention improves a loading speed for the next data and reduces power loss with lessening current consumption, by selecting the input data through IO pad such that the data load path to be programmed is enabled while the data load path to be erased is disabled.

Although the present invention has been described in connection with the embodiment of the present invention illustrated in the accompanying drawings, it is not limited thereto. It will be apparent to those skilled in the art that various substitution, modifications and changes may be made thereto without departing from the scope and spirit of the invention.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A flash memory device comprising:
   an input receiver receiving a plurality of data signals;
   a data selector receiving the data signals and then generating a plurality of control signals to determine a transmission of the data signals according to a level of the data signals;
   a data loading path for transferring the data signals outputted from the input receiver in response to the respective control signals; and
   a page buffer for storing data signals transferred from the data loading path.

2. The flash memory device of claim 1, wherein the data selector includes a plurality of NOR gates to output the control signals in response to an enable signal and the data.

3. The flash memory device of claim 2, wherein the enable signal is a row active signal.

4. The flash memory device of claim 1, wherein the data loading path transfers the data signals of a first level to the page buffer in response to the control signal, and the data loading path does not transfer the data signals of a second level to the page buffer in response to the control signal.

5. The flash memory device of claim 4, wherein the page buffer conserves a potential of power supply voltage level as its initial value when the data signal to be transferred to the page buffer is the second level.

6. The flash memory device of claim 4, wherein the page buffer conserves an initial value when the data is the second level.

7. The flash memory device of claim 6, wherein the initial value of the page buffer is set by a program bias condition.

8. A flash memory device comprising:
   an input receiver receiving a plurality of data signals;
   a data selector including a plurality of NOR gates, wherein the NOR gates receive an enable signal and the respective data signals from the input receiver and generate a plurality of control signals in response to level of the respective data signals;
   a data loading path receiving the control signals from the data selector, wherein the data loading path is enabled or disabled in accordance with the control signal, and a part of the data loading path disabled by the control signal does not transfer the data signal; and
   a page buffer for storing the data signal transferred from the data loading path.

9. The flash memory device of claim 8, wherein the enable signal is a row active signal.

10. The flash memory device of claim 8, wherein the data loading path transfers the data signal of a first level to the page buffer in response to the control signal, and the data loading path does not transfer the data signal of a second level to the page buffer in response to the control signal.

11. The flash memory device of claim 10, wherein the page buffer conserves a potential of power supply voltage level as its initial value when the data signal to be transferred to the page buffer is the second level.

12. The flash memory device of claim 10, wherein the page buffer conserves an initial value when the data signal is the second level.

13. The flash memory device of claim 12, wherein the initial value of the page buffer is set by a program bias condition.

14. A flash memory device comprising:
   an input receiver receiving a plurality of data signals, wherein the respective data signals are divided into a programming data or an erasing data;
   a data selector receiving a row active signal and the data signals from the input receiver and generating a plurality of control signals in response to the programming data or the erasing data;
   a data loading path receiving the control signals from the data selector, wherein the data loading path is enabled or disabled in accordance with the respective control signals; and
   a page buffer for storing the data signal transferred from the data loading path enabled in accordance with the control signal.

15. The flash memory device of claim 14, wherein the data loading path transfers the data signal to the page buffer in response to the control signal when the data signal to be transferred to the page buffer is the programming data, and the data loading path does not transfer the data signal to the page buffer in response to the control signal when the data signal to be transferred to the page buffer is the erasing data.

16. The flash memory device of claim 15, wherein the page buffer conserves a potential of power supply voltage level as its initial value when the data signal to be transferred to the page buffer is the erasing data.

17. The flash memory device of claim 15, wherein the page buffer conserves an initial value when the data signal is the erasing data.

18. The flash memory device of claim 17, wherein the initial value of the page buffer is set by a program bias condition.

* * * * *